(12) United States Patent
Ootori et al.

(10) Patent No.: US 6,650,545 B1
(45) Date of Patent: Nov. 18, 2003

(54) CABINET OF ELECTRONIC DEVICE FOR HOUSING ELECTRONIC COMPONENTS AND ELECTRONIC DEVICE HAVING THE CABINET

(75) Inventors: Yasuhiro Ootori, Kanagawa (JP); Teiyu Goto, Saitama (JP)

(73) Assignee: Sony Computer Entertainment Inc., Tokyo (JP)

(*) Notice: Subject to any disclaimer, the term of this patent is extended or adjusted under 35 U.S.C. 154(b) by 108 days.

(21) Appl. No.: 09/655,208

(22) Filed: Sep. 5, 2000

(30) Foreign Application Priority Data

Sep. 6, 1999 (JP) .............................. P11-251655
Aug. 30, 2000 (JP) .................................. P2000-260711

(51) Int. Cl.$^7$ ................................................ H05K 5/03
(52) U.S. Cl. ......................... 361/729; 361/724; 361/683; 361/686; 248/222.11; 248/680; 434/379
(58) Field of Search ................................. 361/729, 724, 361/725, 756, 714, 679, 683–686; 248/222.11; 6/680; 439/61, 59, 928.1; 434/379

(56) References Cited

U.S. PATENT DOCUMENTS

| | | | | |
|---|---|---|---|---|
| 4,394,055 A | * | 7/1983 | Smith ......................... | 312/196 |
| 5,111,362 A | * | 5/1992 | Flamm et al. ............... | 361/736 |
| 5,206,796 A | * | 4/1993 | Thompson et al. .......... | 361/818 |
| 5,717,575 A | * | 2/1998 | Copeland et al. ........... | 361/756 |
| 5,749,457 A | * | 5/1998 | Castaneda et al. .......... | 200/343 |
| 5,828,546 A | * | 10/1998 | Tirrell et al. ................ | 361/685 |
| 5,936,842 A | * | 8/1999 | Kaiser et al. ............... | 361/752 |
| 6,118,672 A | * | 9/2000 | Yamauchi et al. .......... | 361/818 |

FOREIGN PATENT DOCUMENTS

| | | |
|---|---|---|
| EP | 0 501 456 A2 | 9/1992 |
| EP | 0 501 456 A3 | 9/1992 |
| TW | 281321 | 7/1996 |

* cited by examiner

*Primary Examiner*—Darren Schuberg
*Assistant Examiner*—Yean-Hsi Chang
(74) *Attorney, Agent, or Firm*—Katten Muchin Zavis Rosenman (57) ABSTRACT

It is an object of the preset invention to provide a cabinet for the electronic device which ensures sufficient rigidity of the device even if made thin.

The cabinet (3) according to the present invention has central chassis (4) in which a device main body is provided, and an upper case (5) and a lower case (6), which hold central chassis (4) between them and accommodate the device main body. The upper case (5) and lower case (6) are made thinner than conventional parts of such cabinets so as to make the device smaller. The central chassis (4) serves as a reinforcing material and can improve the rigidity of cabinet (3), thereby ensuring sufficient rigidity for the cabinet (3) even if the upper case (5) and the lower case (6) are made thinner to achieve a smaller size of the electronic device.

18 Claims, 11 Drawing Sheets

CABINET OF ELECTRONIC DEVICE FOR HOUSING ELECTRONIC COMPONENTS AND ELECTRONIC DEVICE HAVING THE CABINET

FIELD OF THE INVENTION

This invention relates to a cabinet for an electronic device inside which electronic components are housed, and an electronic device having such cabinet.

BACKGROUND OF THE INVENTION

There has long been a demand that video game machines and other electronic devices be made smaller in order to improve their portability and ease of handling. One way to achieve such smaller device size would be to reduce the thickness of the cabinet in which the main body of the electronic device is housed (hereafter called the cabinet), making the electronic device smaller while securing a volume of space in which to accommodate the main body.

The usual way to make such a cabinet for housing a device main body is to contact the ends of a pair of housing members that have a cross-section in the shape of a squared-off C, so as to oppose them to each other at upper and lower positions.

However, because the housing members that form the cabinet are generally formed with a resin that has a wide range of uses, such as ABS resin (a resin made with acrylnitryl-butadiene-styrene copolymer), sufficient rigidity of a cabinet cannot be ensured if, in order to make the device smaller, the thickness is reduced too much.

Thus in the structure of a conventional cabinet, the cabinet cannot be made too thin in the pursuit of a smaller device size, and it has been difficult to reduce the size of the electronic device because of this problem.

SUMMARY OF THE INVENTION

It is an object of the present invention to provide a cabinet of an electronic device that ensures sufficient rigidity even if made thin, and an electronic device that promotes a smaller size by the use of such cabinet.

A cabinet for an electronic device according to the present invention is one which houses therein electronic components that form the electronic device, wherein the cabinet has a chassis on which electronic components are provided and a pair of housing members that hold the chassis therebetween and house the electronic components.

Due to the present invention, the chassis serves as a reinforcing material, making it possible to improve the rigidity of the cabinet. Therefore, sufficient rigidity for the cabinet can be ensured even if the thickness of the housing members is reduced to achieve a smaller size.

In this invention, preferably, one of the pair of housing members may have a smaller volume than another housing member and the cabinet may be constituted asymmetrically relative to the chassis.

In this way, the components that take up relatively little space, such as circuit boards, are accommodated in the smaller-volume housing member, and the components that take up relatively large space, such as power source units or disk drives, are accommodated in the larger-volume housing member, thus making it possible to efficiently utilize the space inside the cabinet so as to minimize empty space.

It is preferable that the aforesaid pair of housing members and chassis may be made integral by a screw inserted into a screw hole formed in one of the pair of housing members.

In this way, the pair of housing members and chassis can be made integral by connecting them once with a single screw, thus facilitating the cabinet assembly operation.

If the screw hole is formed only in one of the housing members, then by taking as the base the surface in which the screw hole is formed, one can hide that screw hole and the screw, etc. inserted into this screw hole, thereby improving the appearance of the cabinet.

In this invention, a rear surface part that covers the rear surface of the cabinet for an electronic device may preferably be provided on the chassis.

In this way, the components of the electronic device provided on the rear surface part of the cabinet, such as a power switch exposed on the rear surface of the cabinet and an exhaust fan installed on the back side of the rear surface, can be previously provided on the chassis, thus making the electronic device easier to assemble than if the components on the rear surface were fabricated separately.

In addition, an electronic device of the present invention includes said cabinet.

According to the present invention, because the electronic device has a cabinet whose rigidity is ensured even if it is thin, the prescribed volume of space inside the cabinet is also ensured, and to the extent that the cabinet is made thinner, a smaller size for the electronic device can be achieved.

In this invention, the electronic device may have a power source circuit board for supplying the power source and a control board to control the electronic device, and the power source circuit board and control board may preferably be arranged on opposite sides with the chassis between them.

Thus the chassis serves as a partition between the power source circuit board and the control board, making it possible to increase the insulation surface distance (the electrical insulation distance) between the boards, thus simply preventing the phenomenon of electrical discharge between said boards. In this way, if the boards are arranged near the chassis, the space inside the cabinet can be used efficiently, and the electronic device can be made even smaller.

DETAILED DESCRIPTION OF THE PREFERRED EMBODIMENT

In the following, with reference to the drawings, an embodiment of the present invention will be described.

(1) Overall Arrangement of the Device

Figure 1:
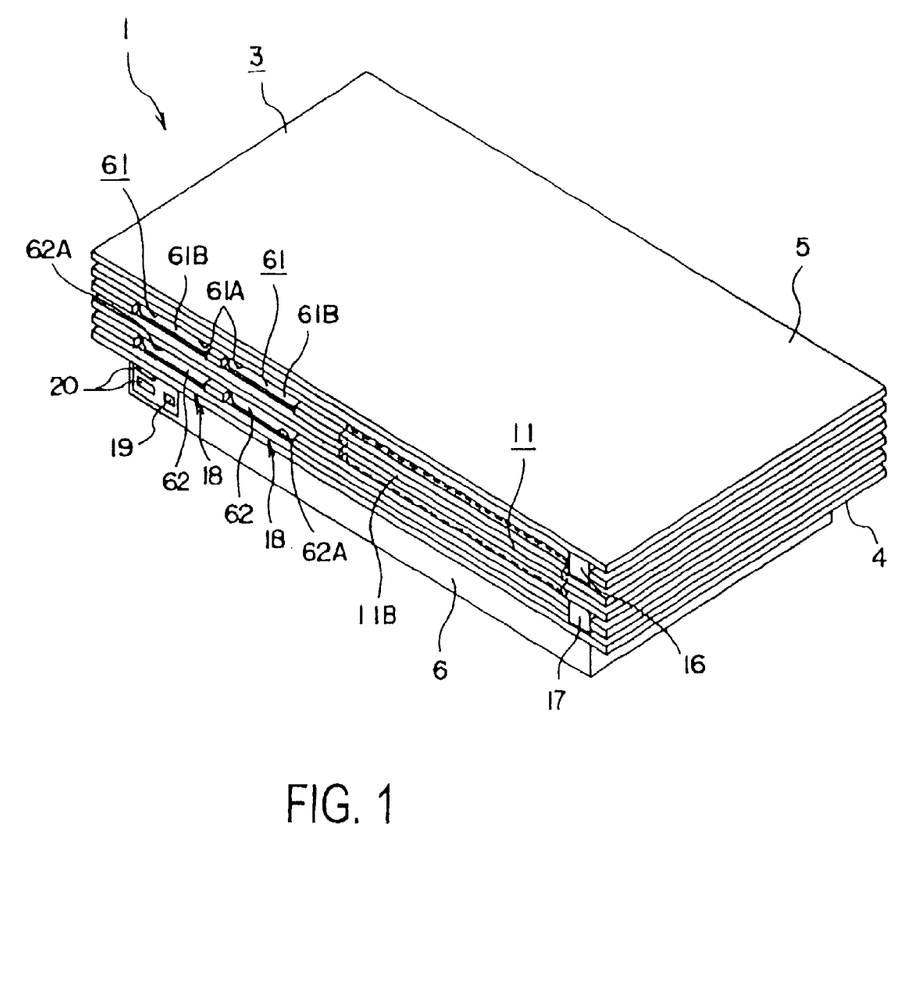
FIG. 1 is a schematic, perspective view of a video game device according to an embodiment of the present invention.
Figure 2:
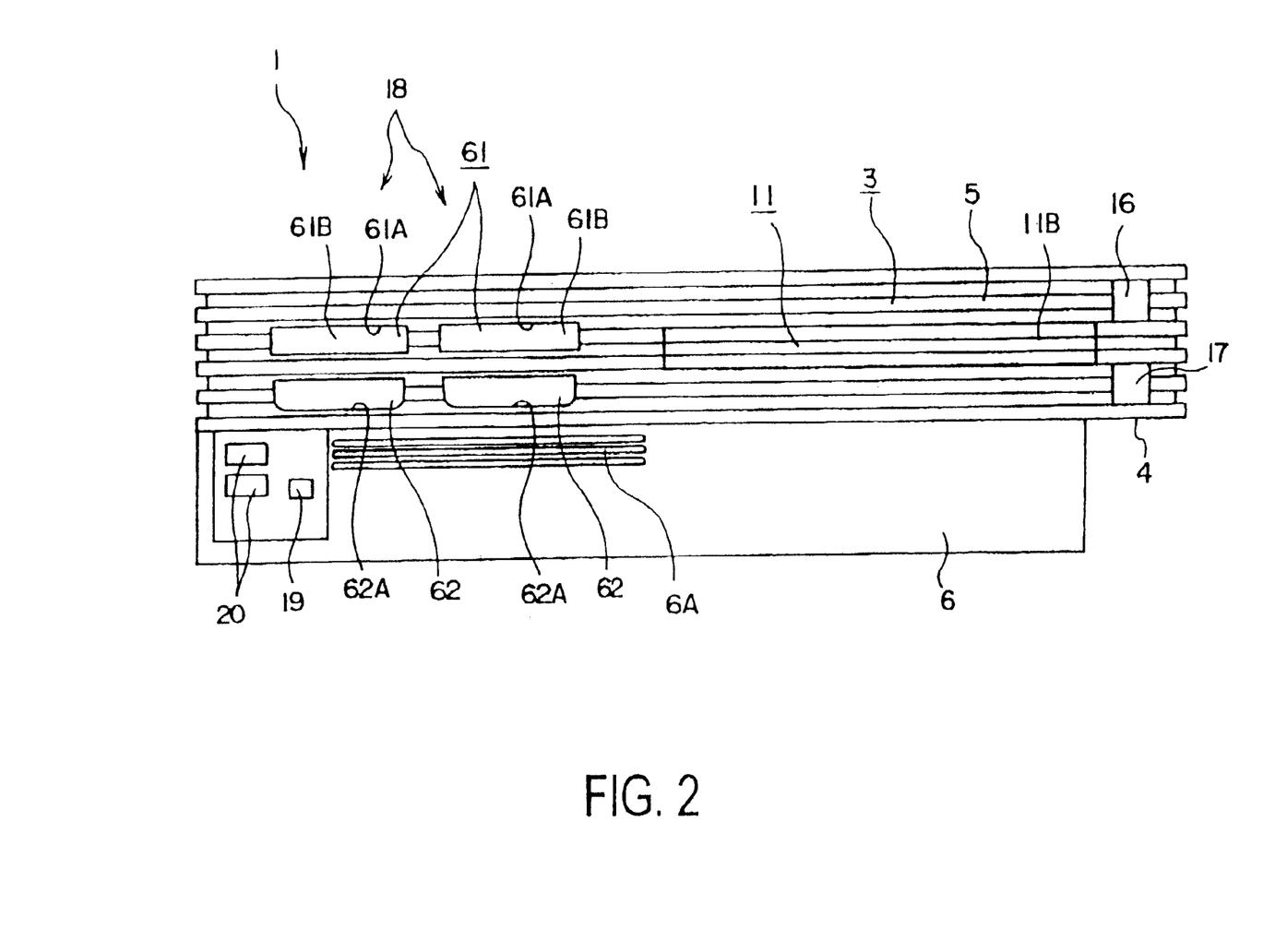
FIG. 2 is a front view of the video game device.
Figure 3:
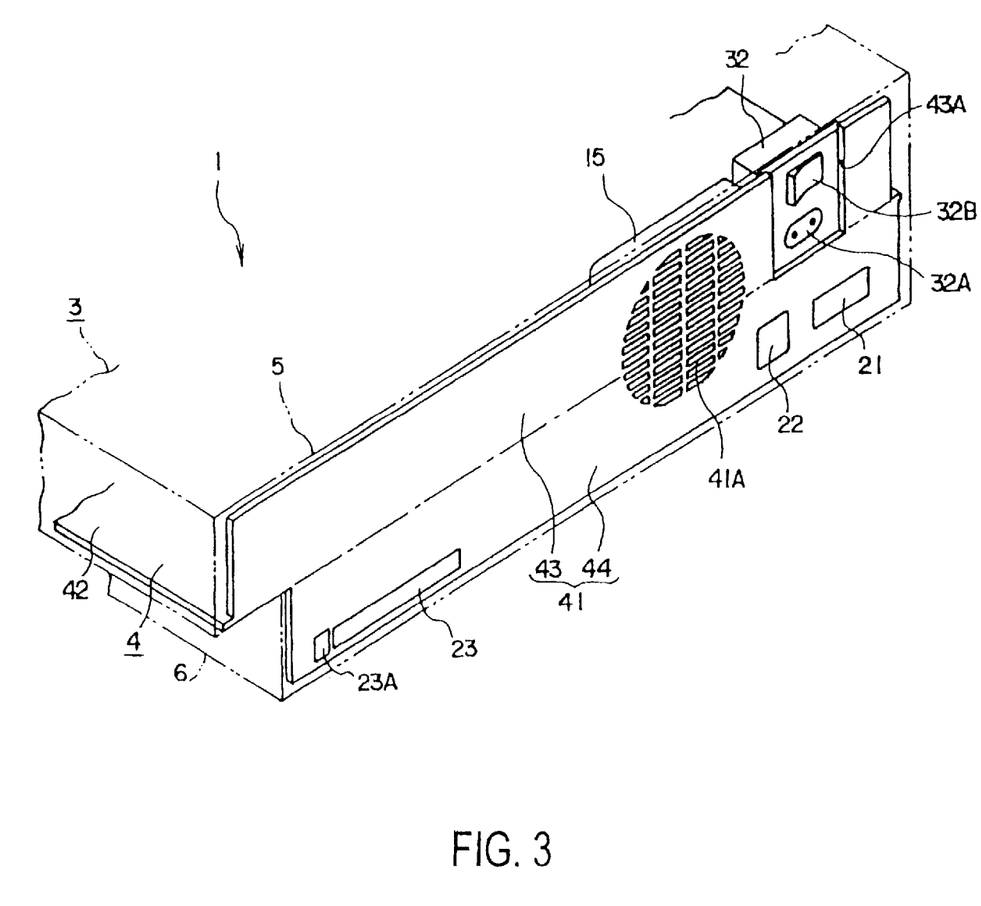
FIG. 3 is a perspective view of the video game device of the present invention.
Figure 4:
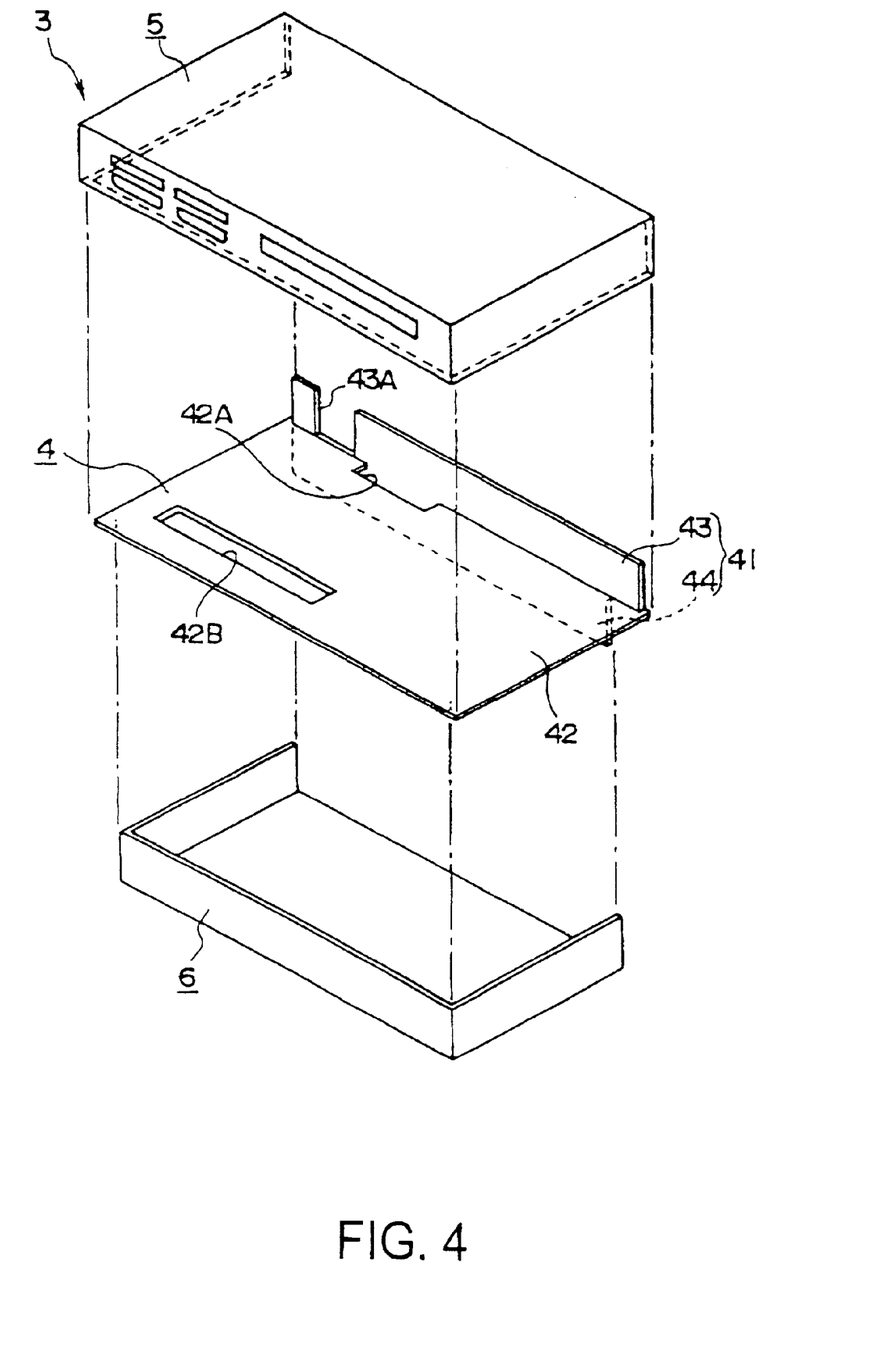
FIG. 4 is an exploded, perspective view of a cabinet of the video game device.
Figure 5:
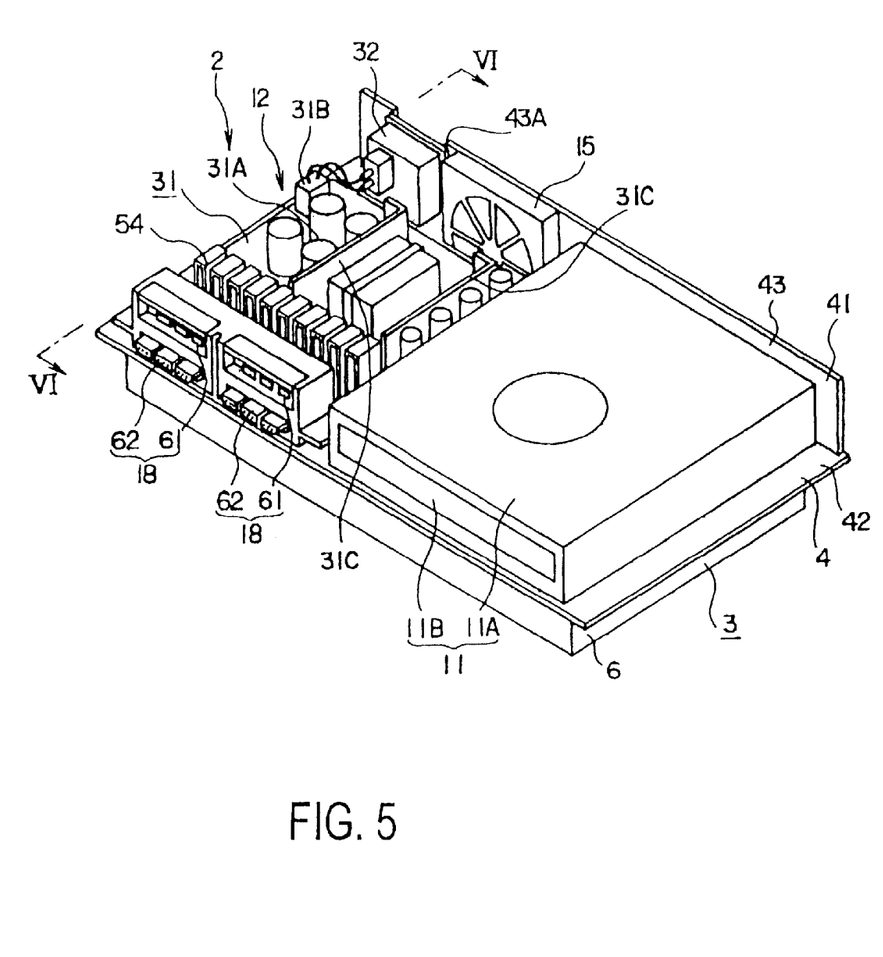
FIG. 5 is a perspective view of the internal structure of the video game device.

FIGS. 1 to 5 are schematic diagrams showing a video game device 1, which is an electronic device according to an embodiment of the present invention; FIG. 1 is a perspective view of device 1 seen from above, FIG. 2 is a front view of device 1 seen from the front, FIG. 3 is a perspective view of device 1 seen from the rear, FIG. 4 is an exploded, perspective view of a cabinet 3, and FIG. 5 is a perspective view of the interior of device 1, seen from above.

Video game device 1, for example, reads a game program recorded on an optical disk or other medium and executes it according to instructions from the users (game players). "Executing a game" means mainly controlling the progress of the game as well as display and sound.

Video game device 1 includes a main body 2, which has electronic components, etc., and the cabinet 3 (hereafter called the "cabinet"), which houses the main body 2.

As shown in FIG. 4, cabinet 3 has a central chassis 4, in which the main body 2 is provided, and an upper case 5 and a lower case 6, which are housing members that hold central chassis 4 between them and house the main body 2. The cabinet 3 is formed in a square on the plane and in roughly L shape in front.

Here, upper case 5 and lower case 6 are made thinner than usual to achieve a smaller size of the device, but the central chassis 4 ensures that cabinet 3 has sufficient rigidity.

On the front right side (the right side as seen from the front) of upper case 5 is provided disk device 11, which controls the operation of a CD-ROM (compact disk read-only memory), DVD-ROM (digital video disk ROM or digital versatile disk), or other optical disk, and which is a storage medium where video game application programs are recorded, and disk tray 11B of this disk device 11 is exposed.

On the right side (the right side as seen from the front) of disk tray 11B are arranged, on top and bottom, a power switch 16 and a tray operation switch 17 for performing the operation of inserting disk tray 11B into and ejecting it from upper case 5.

On the front left side (the left side as seen from the front) of upper case 5, two slots 18 are exposed. Each slot 18 has a memory card insertion unit 61 positioned at the top and a controller connection unit 62 positioned at the bottom.

A memory card or other external auxiliary memory device is inserted into memory card insertion unit 61, and its insertion hole 61A is formed in the shape of a rectangle that is long in its longitudinal direction. Provided on this memory card insertion unit 61 is a shutter 61B for protecting the connection terminal that is provided inside it.

Controller connection unit 62 is an input-output terminal for performing input and output of signals, to which is connected a connection terminal formed at the end of a controller cable that extends from a controller serving as an operation means. Its insertion hole 62A is formed approximately in the shape of a rectangle that is long in its longitudinal direction, with the lower corners shaped rounder than the upper corners.

By forming insertion hole 62A in this way, the connection terminal of the controller is kept from being connected in the wrong orientation. And because the shape of insertion hole 62A is given a different structure from the shape of insertion hole 61A for memory card insertion unit 61, there is no danger of erroneously inserting an external auxiliary memory device into insertion hole 62A.

Having two of such controller connection units 62 makes it possible to connect two controllers, allowing two users to play competitive games, etc.

The results of operating the controller connected to each controller connection unit 62 are recorded onto an external auxiliary memory device inserted into memory card insertion unit 61 located above each.

The front surface and right-side surface (the side surface on the right side as seen from the front) of lower case 6 lie inside the corresponding front surface and right-side surface of upper case 5 above it. In other words, the width and depth of lower case 6 are set smaller than the width and depth of upper case 5, and the volume of lower case 6 is smaller than the volume of upper case 5. On the other hand, the left-side surface (the side surface on the left side as seen from the front) of lower case 6 matches the corresponding surface of upper case 5. Thus cabinet 3 is constructed asymmetrically about the central chassis 4 (see FIGS. 2 and 6).

The plane surrounded by the front surface and side surface of lower case 6 is the lower surface that is in contact with the surface of the floor (not shown). That is, video game device 1 is set up in horizontal orientation extending in the horizontal direction, with the lower surface of the lower case touching the floor.

When video game device 1 is set up in horizontal orientation, the volume of lower case 6 is less than the volume of upper case 5, that is, the lower half of the cabinet of video game device 1 is smaller than its upper half, so video game device 1 as a whole has the effect of seeming compact to the game players.

Upper case 5 protrudes forward from lower case 6 in the front surface that faces the user (the game player). This makes the switches on the front of upper case 5 even more convenient to operate for the user. Similarly, the mounting part for peripheral devices on the front of upper case 5 is even more convenient for the user when attaching and detaching peripheral devices.

As mentioned above, the left-side surface of lower case 6 matches the corresponding surface of upper case 5. That is, the left-side surface of lower case 6 and the left-side side surface part of upper case 5 are in the relationship of forming the same plane (in other words, they are coplanar). As a result, video game device 1 can also be set up in vertical orientation, in which this left-side surface becomes the base. The fact that video game device 1 can be used in either horizontal or vertical orientation to fit the user's use environment increases the usable space for the video game device 1.

Exposed on the front left side (the left side as seen from the front) of lower case 6 are a data transfer terminal 19 and two external device connection terminals 20 for connecting external devices.

Data transfer terminal 19 conforms to the IEEE 1394 standards, and by connecting a cable connected to this terminal to a digital camera or video deck, etc., one can take into video game device 1 the picture and sound, etc. recorded with the digital camera or video deck.

The two external device connection terminals 20 conform to the USB (universal serial bus) standards and allow one to connect a keyboard or other input device, a mouse or other pointing device, a printer or other printing device, or an external memory device, etc. that employs a magnetooptical disk or other magnetic medium.

Formed on the front of lower case 6, along its longitudinal direction, are slit-like openings 6A for letting in air taken in from outside as cooling air into the interior of device 1.

As shown in FIGS. 3 and 4, central chassis 4 has, and is formed integrally with, a rear surface part 41, which forms the rear surface of video game device 1, and a board-like middle shelf 42, which is provided so as to be perpendicular in the middle part of this rear surface part 41 in the height direction.

Rear surface part 41 consists of an upper rear surface part 43, which covers the rear surface of cabinet 3 and is formed approximately in the shape of a rectangle and is long enough to block part of the rear surface of upper case 5, and lower rear surface part 44, which is formed approximately in the shape of a rectangle and is long enough to block part of the rear surface of upper case 6.

As shown in FIG. 4, a rectangular notch 43A is formed near the right end edge of upper rear surface part 43 in FIG. 3. Arranged in this notch 43A are AC inlet 32A, which is a power supply terminal for supplying power from an external power source to device main body 2, and a main power switch 32B, which operates the supply of power from an external power supply.

Exposed near the right end edge of lower rear surface part 44 in FIG. 3, below this notch 43A, is a video-audio output terminal 21 for outputting video, audio and other signals recorded on an optical disk to a television or other display device.

Exposed next to video-audio output terminal 21 is a communication terminal 22 for communicating with external devices. This communication terminal conforms to the IrDA (Infrared Data Association) standards, which are standards for data communication using infrared rays, and if this terminal is provided on an external device, data can be transmitted and received by infrared communication, with no need to connect a cable, etc. between device 1 and the external device.

Exposed near the left end edge of lower rear surface part 44 in FIG. 3 is a PCMCIA slot 23, into which are inserted various card-type peripheral devices that conform to the PCMCIA (Personal Computer Memory Card International Association) standards, such as a memory card or modem card. A card-type peripheral device inserted into the PCMCIA slot 23 can be removed by pressing eject button 23A, which is exposed to the side of the PCMCIA slot 23.

Provided approximately in the center of rear surface part 41 is an exhaust opening 41A, through which the air inside device 1 is expelled.

Middle shelf 42 is formed in the shape of a board having approximately the same width as upper case 5 and approximately the same depth as said upper case 5, and it is provided at right angles at the interface part of the upper rear surface part 43 and lower rear surface part 44.

A notch 42A for accommodating an exhaust fan 15 is formed in the part of this middle shelf 42 that corresponds to exhaust opening 41A provided in rear surface part 41.

(2) Internal Structure of the Device.

Figure 6:
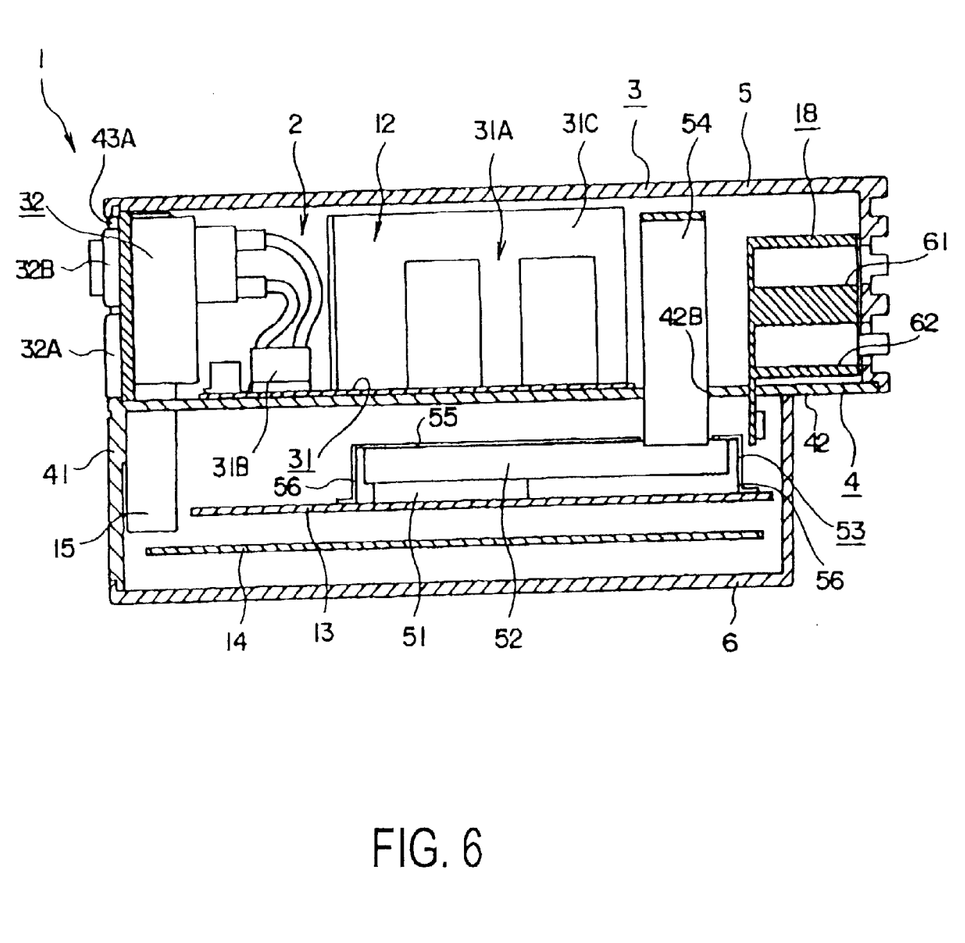
FIG. 6 is a cross-sectional view along line VI—VI in FIG. 5.
Figure 7:
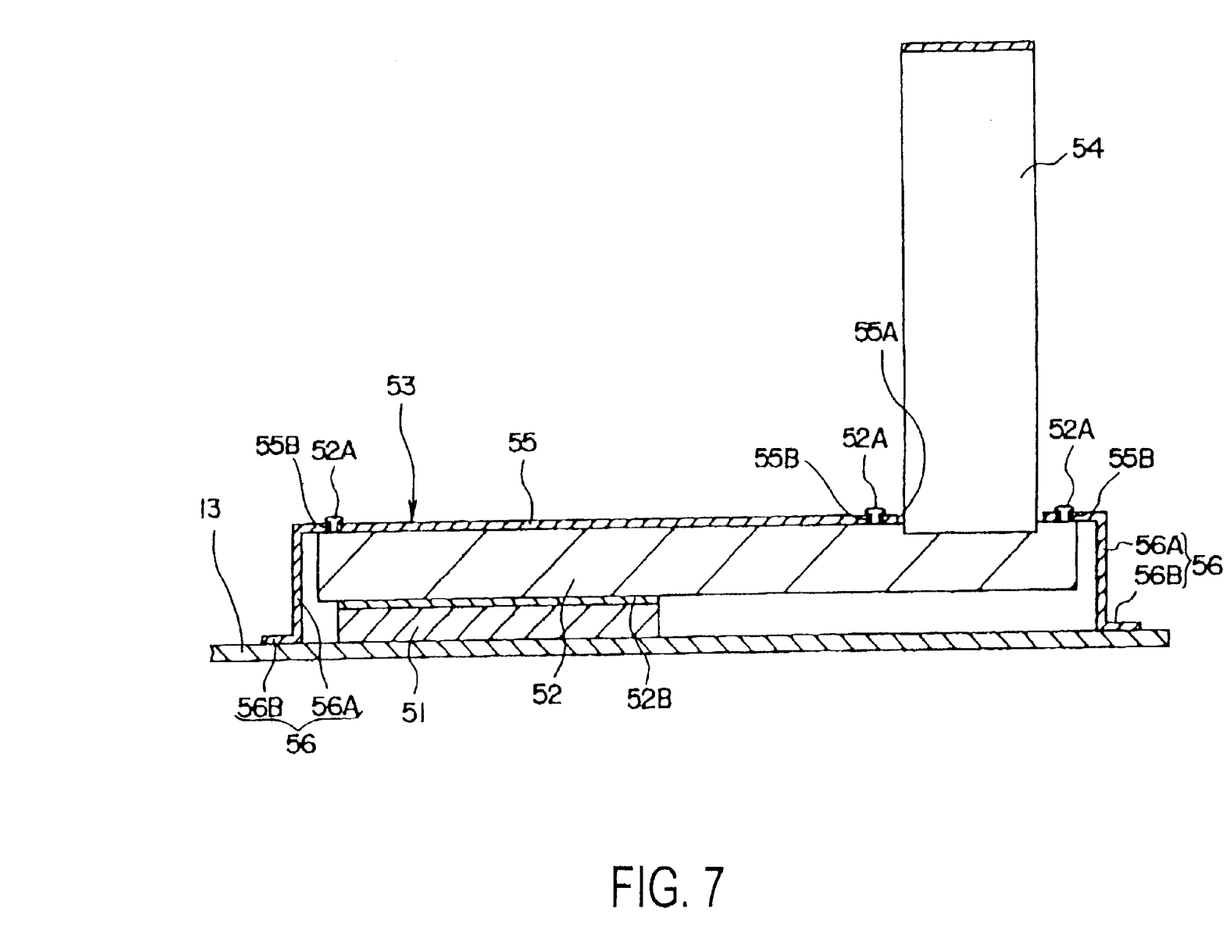
FIG. 7 is a cross-sectional view showing a heat dissipation and shielding structure of the CPU of the electronic device.

FIGS. 5 to 7 show the internal structure of video game device 1. FIG. 5 is a schematic, perspective view of the interior of device 1, FIG. 6 is a perpendicular cross-sectional view of video game device 1, and FIG. 7 is an enlarged cross-sectional view showing the essential parts.

In the drawings, the main body 2, which is provided on central chassis 4, is built into the interior, which is enclosed by upper case 5 and lower case 6.

The main body,2 has a disk device 11, a power source unit 12, a main board 13, which is the main control circuit board, and an input-output signal control board 14, etc.

The disk device 11 and power source unit 12 are arranged on the middle shelf 42 of central chassis 4, and the main board 13 and input-output signal control board 14 are arranged in layers in the space that is formed by middle shelf 42 and lower case 6. That is, disk device 11 and power source unit 12, and main board 13 and input-output signal control board 14, are arranged on opposite sides across the central chassis 14.

Power source unit 12 has a power source circuit board 31, which is mounted on middle shelf 42 of the central chassis 4, and a power source unit 32, into which electric power is input from an external power source.

Power source unit 32 has the AC inlet 32A and a main power switch 32B, and is connected to power source circuit board 31 via a connector 31B. That is, electric power from the external power source is supplied to power source circuit board 31 through AC inlet 32A by turning on the main power switch 32B.

Power source circuit board 31 occupies approximately half the plane area of middle shelf 42, and electric power supplied from the external power source is converted to the prescribed voltage by capacitors, coils, transformers, and other circuit elements 31A that make up said power source circuit board 31. Provided on power source circuit board 31 is a flat L-shaped guide plate 31C for guiding cooling air that is brought in through opening 6A which formed in the front surface of the lower case 6, in the prescribed direction.

In this way, power source unit 12 supplies to disk device 11 and boards 13, 14, etc. the power that is obtained by power source circuit board 31.

Attached on the side of exhaust outlet 41A of the power source unit 12 is an exhaust fan 15 in a position that corresponds to the exhaust outlet 41A. The exhaust fan 15 is also driven by the electric power from power source unit 12.

Arranged on the side of exhaust outlet 41A of the power source unit 12 and near opening 6A on the opposite side are a rectangular heat sink 54 and slots 18.

The disk device 11 plays a CD-ROM, DVD-ROM, or another optical disk and includes a main body 11A, inside which an optical pickup unit (not shown) is accommodated, and the disk tray 11B, by which an optical disk is loaded onto the main device main body 11A, and the disk device 11 is placed on the middle shelf 42 in the space next to power source unit 12.

Main board 13, which has a control system (not shown) having a central processing unit (CPU) 51 and its peripheral devices, etc., a graphic system (not shown) including image processing equipment that renders pictures, and a sound system (not pictured) including audio processing equipment that generates music and sound effects, etc., and the main board 13 is provided in a position closest to and opposite the lower surface of middle shelf 42.

The control system has CPU 51, a peripheral device controller that excludes interrupt control, control of direct memory access (DMA) data transfers, etc., a main memory that consists of a random access memory (RAM) and a read-only memory (ROM) in which are stored programs, such as so-called operating system, which manages and controls the main memory, graphic system, and sound system, etc. The "main memory" here refers to the memory in which programs can be executed.

CPU 51, which controls the video game device 1 as a whole by executing the operating system stored in ROM, consists of, for example, a 128-bit RISC (reduced instruction set computer) CPU.

The graphic system has an image processing device that renders pictures under drawing instructions from CPU 51, and a frame buffer in which images rendered by this image processing device are stored.

The image processing device draws polygons, etc. to the frame buffer in accordance with drawing commands from CPU 51. This image processing device is able to draw up to about 75 million polygons per second.

The sound system has an audio processing device that plays background music and sound effects, etc. under instructions from CPU 51, and a sound buffer in which waveform data, etc. is stored by the audio processing device.

As shown in FIG. 7, attached to the top of the CPU 51 by an adhesive 52B is a heat conducting member 52, which is made of high-thermal-conductivity aluminum. Provided on the upper surface of the heat conducting member 52 are multiple T-shaped pins 52A spaced at prescribed intervals.

CPU 51 and heat conducting member 52 are covered by a shielding member 53 which is made of metal.

More specifically, the shielding member 53 includes a flat shielding part 55 which comes into contact with the upper surface of the heat conducting member 52, and side shielding parts 56 which have an L-shaped cross section extending from both ends of the flat shielding part 55 to the upper surface of the main board 13.

Formed on the flat shielding part 55 are holes 55B, which are positioned to correspond to pins 52A provided on the upper surface of the heat conducting member 52. That is, by inserting pins 52A into holes 55B and making the upper part of pins 52A protrude against the upper surface of flat shielding part 55, the flat shielding part 55 is engaged by pins 52A and is anchored onto the heat conducting member 52.

Each side shielding part 56 has a vertical part 56A, which extends downward from the end of the flat shielding part 55, and a horizontal part 56B, which extends horizontally outward from the end of the vertical part 56A and whose lower surface comes into contact with the upper surface of the main board 13.

Providing the shielding member 53 makes it easy to keep outside disturbances such as noise generated from input-output signal control board 14 or power source unit 12 from intruding into CPU 51, and makes it possible to securely maintain the stable operation of CPU 51.

A rectangle-shaped rectangular heat sink 54 is provided on the upper surface of the end of heat conducting member 52. The rectangular heat sink 54 extends from the upper surface of heat conducting member 52 to near the top of upper case 5. As shown in FIGS. 4 and 7, openings 42B, 55A are formed in middle shelf 42 and flat shielding part 55 in positions corresponding to where rectangular heat sink 54 is provided.

Thus, by transmitting the heat generated by CPU 51 along the heat conducting member 52 and rectangular heat sink 54 and dissipating it within device 1, the CPU 51 can be cooled in a simple manner. Moreover, by taking in cooling air through opening 6A and exhausting the heat that builds up within the electronic device 1 outside of electronic device 1 by means of exhaust fan 15, it becomes easy to further improve the cooling effect on CPU 51.

The input-output signal control board 14 (FIG. 6), which is arranged below the main board 13, has an optical disk controller (not shown) that performs control of the optical disk on which application programs are recorded, as well as a communication controller (not shown) that controls the input and output, etc. of signals from the controller into which instructions from the users are input, signals that are output to the controller, and data from external auxiliary memory devices that store video game settings, etc.

The optical disk controller has a decoder that decodes the programs and data, etc. that are recorded with, for example, an appended error correction code (ECC), and a buffer that speeds up the reading of data from the optical disk by temporarily storing data from disk device 11.

Electrically connected to the communication controller is one end of each of the slots 18, which includes a controller connection unit 62 and a memory card insertion unit 61 (FIG. 6), which control the input and output of signals from the controller into which instructions from the users are inputted, signals that are outputted to the controller, and data from external auxiliary memory devices that store video game settings, etc. Also electrically connected to this communication controller are, besides slots 18, data transfer terminal 19, external device connection terminal 20, communication terminal 22, and PCMCIA slot 23, etc. The communication controller also controls the input and output of signals with external devices, etc. connected to and inserted into these terminals, etc.

In the video game device 1 having the above-described internal structure, when main power switch 32B is turned on and power switch 16 is pressed, CPU 51 of the control system executes the operating system recorded in the ROM to thereby control the device 1. Thereafter, the CPU 51 controls the aforesaid graphic system, sound system, etc.

When the operating system is executed, CPU 51 initializes video game device 1 as a whole, including confirming its operation, etc., then controls the disk device 11 and executes a game or other application program recorded on the optical disk. By executing this game or other program, CPU 51 controls the graphic system and sound system, etc. in accordance with input from the users and controls the display of images and the generation of sound effects and background music.

When this is done, heat generated by CPU 51 is transmitted along heat conducting member 52 and rectangular heat sink 54 and is dissipated inside device 1. The heat that is released is discharged by exhaust fan 15 outside of the video game device 1, together with the heat generated from power source unit 12 and the heat generated from disk device 11.

Rectangular sink 54, CPU 51 and power source unit 12, etc. are cooled by the cooling air sucked into device 1 through opening 6A. This improves the cooling efficiency inside the device 1. After the cooling air cools the interior of device 1, it is directed by guide plate 31C, etc. and is exhausted through exhaust opening 41A to the rear side of device 1 by exhaust fan 15.

(3) Cabinet Assembly Structure

Figure 8:
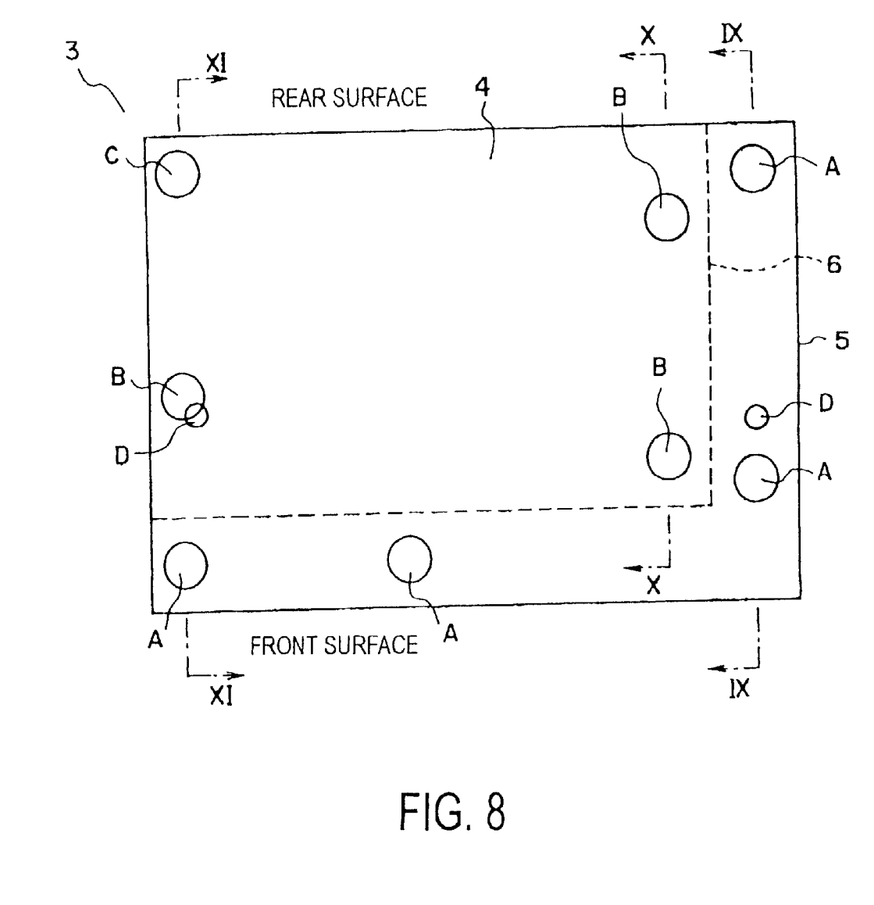
FIG. 8 is a schematic, plan view showing the connection positions of an upper case, a central chassis, and a lower case that constitute the cabinet.
Figure 9:
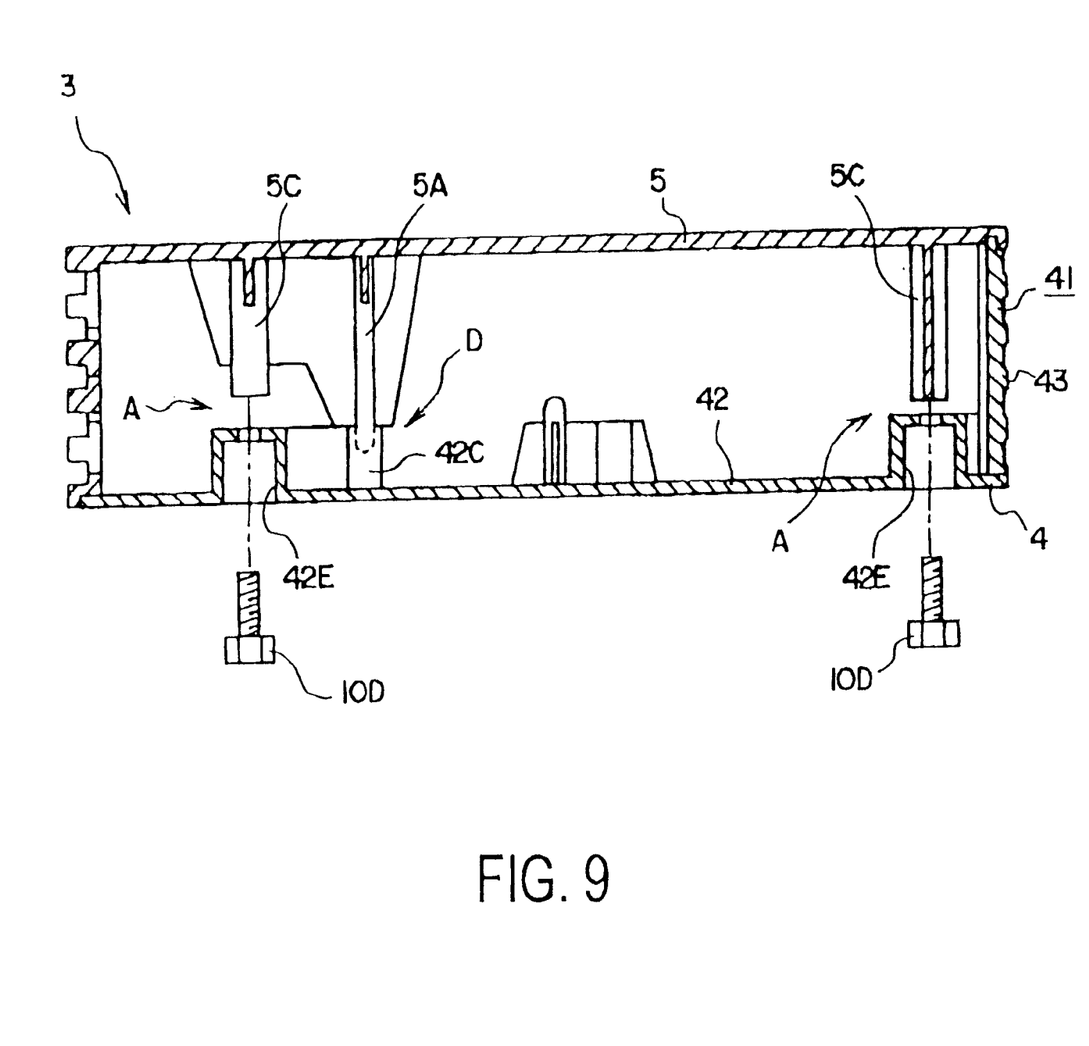
FIG. 9 is a cross-sectional view of the upper part of the device along line IX—IX in FIG. 8.
Figure 10:
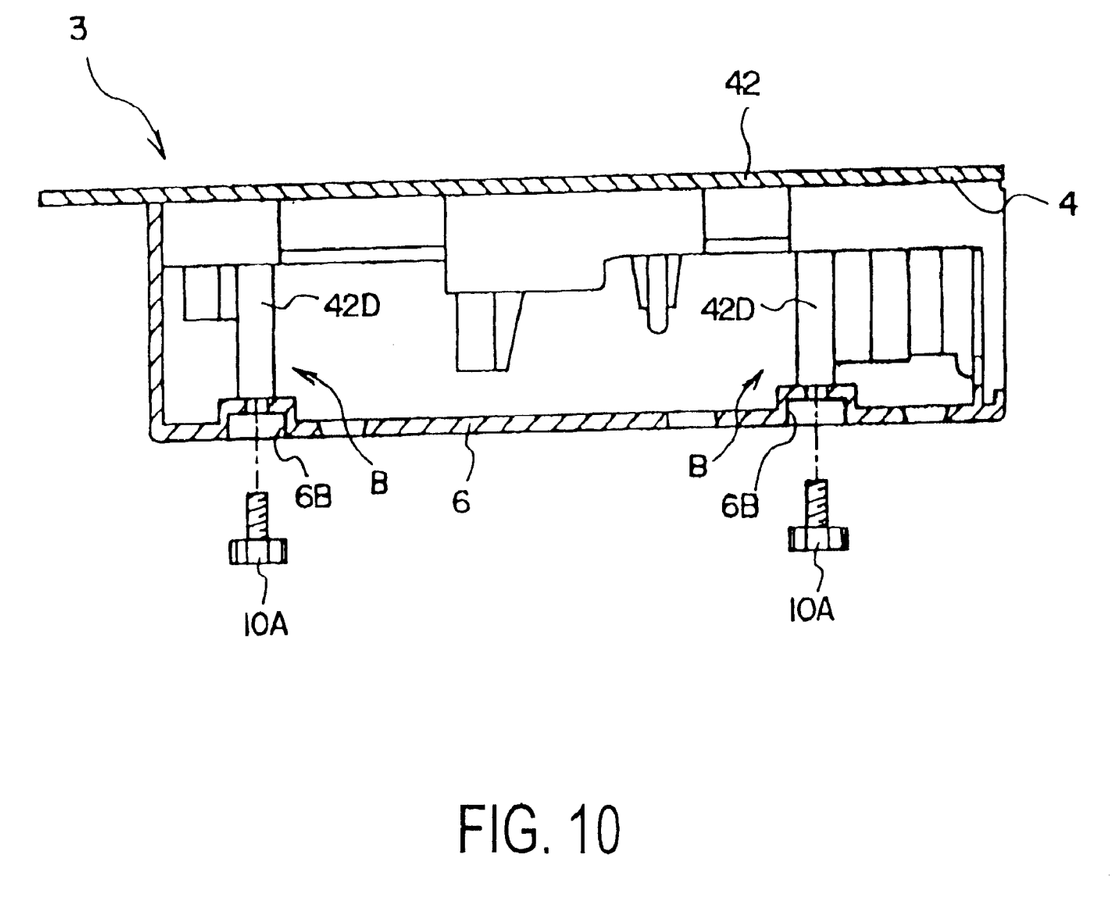
FIG. 10 is a cross-sectional view of the lower part of the device along line X—X in FIG. 8.
Figure 11:
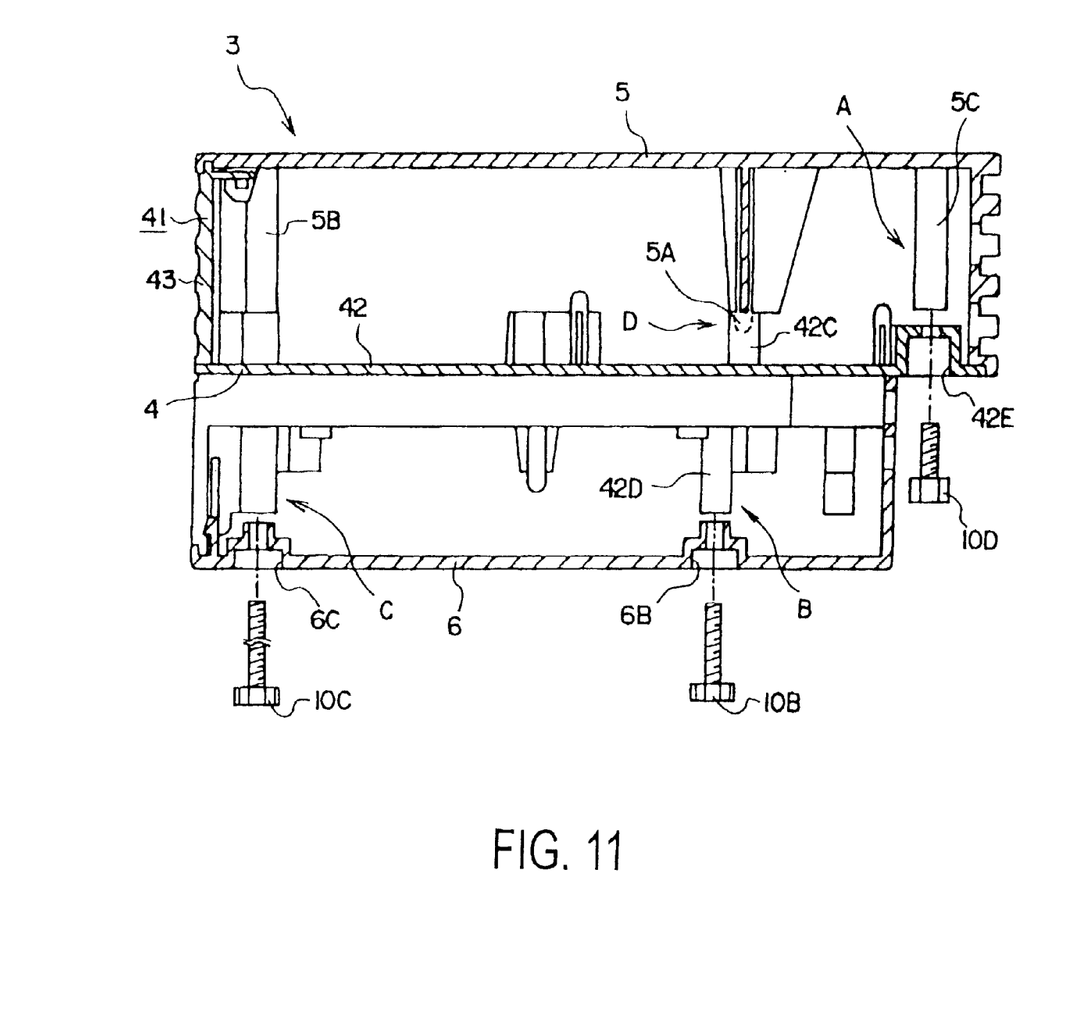
FIG. 11 is a cross-sectional view along line XI—XI in FIG. 8.

FIGS. 8 to 11 show the assembly structure of cabinet 3. FIG. 8 is a schematic diagram showing connection among upper case 5, central chassis 4, and lower case 6; FIGS. 9 and 10 are cross-sectional views seen from the right front side, and FIG. 11 is a cross-sectional view seen from the left front side.

Provided on the inside surface of upper case 5 are rod-like protrusions 5A pointing toward center chassis 4, as shown in FIG. 9. The tips of these protrusions 5A fit into receptacles 42C, which are fixed to the upper surface of center chassis 4 (the places shown by circles D in FIG. 8).

Multiple screw holes 42E into which to insert screws 10D are formed in the lower surface of center chassis 4. Arranged above these screw holes 42E are spacers 5C that protrude downward from the inside surface of the upper case. Threading is formed inside these spacers 5C (at places shown by circles A in FIG. 8).

That is, the upper case 5 and central chassis 4 are made integral by fitting together protrusions 5A and receptacles 42C, inserting screws 10D through screw holes 42E, and screwing the screws 10D into the threading of spacers 5C.

As shown in FIG. 10, multiple screw holes 6B to insert screws 10A, 10B into are formed on the lower surface of lower case 6. Arranged above the screw holes 6B are spacers 42D that protrude downward from the lower surface of center chassis 4. Threading is formed inside these spacers 42D. Therefore lower case 6 and central chassis 4 are made integral by inserting screws 10A, 10B through screw holes 6B and screwing said screws 10A, 10B into the threading of spacers 42D (at the places shown by circles B in FIG. 8).

Also, as shown in FIG. 11, above some of these screws holes 6B, namely above screw hole 6C, is provided a through spacer 5B that protrudes from the inside surface of upper spacer 5 through center chassis 4 to the screw hole 6C. That is, lower case 6, center chassis 4, and upper case 5 are integrally connected (made integral) by putting screw 10C through this screw hole 6C and screwing said screw 10C into the threading of through spacer 5B (at the place shown by circle C in FIG. 8).

The above-described configuration of the cabinet has the following effects:

Namely, cabinet 3 is formed by central chassis 4, upper case 5, and lower case 6, and the rigidity of cabinet 3 is improved by using chassis 4 as reinforcing material, thus ensuring sufficient rigidity for cabinet 3 even if the thickness of the upper case 5 and lower case 6 is reduced to obtain of smaller size of the device.

Also, cabinet 3 is constituted asymmetrically about central chassis 4, parts that take up relatively little space, such as the main board 13 and input-output control board 14, are accommodated in lower case 6, which has a small volume, while parts that are relatively bulky, such as power source unit 12 and disk device 11, are accommodated in upper case 5, which has a large volume, thereby efficiently utilizing the space inside cabinet 3 so as to minimize empty space.

In addition, lower case 6, central chassis 4, and upper case 5 are connected and made integral at once by screws 10C inserted into screw holes 6C formed in lower case 6, thus facilitating the operation of assembling cabinet 3. And because the screw holes 6C are formed only in lower case 6 and the surface in which screw holes 6C are formed serves as the base, the screw holes 6C and the screws 10C, etc. that are inserted into these screw holes 6C can be hidden, improving the appearance of cabinet 3.

Also, because the rear surface part 41, which covers the rear surface of cabinet 3, is provided on central chassis 4, parts provided on the rear surface part of cabinet 3, such as main power switch 32B exposed on the rear surface of cabinet 3 and the exhaust fan 15 installed on the back side of the rear surface, can be previously provided on central chassis 4, thus making the video game device 1 easier to be assembled than if the rear surface parts were fabricated separately.

Further, with the video game device 1, having the cabinet 3 whose rigidity is assured even if it is thin, the prescribed volume of the space inside cabinet 3 is ensured and a smaller size of video game device 1 can be achieved.

Because the power source circuit board 31 on the one hand and main board 13 and input-output control board 14 on the other hand are arranged on opposite sides with center chassis 4 between them, it is possible to increase the insulation surface distance (the electrical insulation distance) between power source circuit board 31 on the one hand and main board 13 and input-output control board 14 on the other hand, thus simply preventing the phenomenon of electrical discharge between them. In this way, by arranging power source circuit board 31 and main board 13 and input-output control board 14 near the middle shelf 42 of central chassis 4, the space inside cabinet 3 can be used efficiently, and video game device 1 can be made even smaller.

Concerning the cabinet of the video game device 1, an arrangement having central chassis 4, which has relatively strong rigidity, the upper case 5, which is formed above the central chassis with the central chassis as its base plate, and the lower case 6, which is formed below the central chassis with the central chassis as its upper plate has been described. Because the pair of cases 5, 6 have different sizes, they hold the central chassis between them so that part of central chassis 4 protrudes. Therefore by changing the relative positional relationship between the cases 5, 6, the shape of the cabinet 3 as a whole can be changed in various ways, for example by aligning the pair of cases in the center, making their left surfaces coplanar, or crossing their longitudinal direction at right angles. That is, the cabinet 3 of the video game device 1 adopts an arrangement having a high degree of freedom in its overall shape.

The present invention is not limited to the above embodiment but includes other arrangements, etc. that can achieve the purpose of this invention, including modifications such as the following.

For example, central chassis 4 was provided between power source circuit board 31 and main board 13 and input-output signal control board 14, but it is not limited to this; if, for example, they can be arranged far enough apart to prevent electrical discharge between the plates, the embodiment may be suitably prescribed without providing central chassis 4.

Nor is the chassis limited to having a rear surface part; this may be eliminated if, for example, the parts that constitute the device main body are all provided on the middle shelf.

Also, lower case 6, central chassis 4, and upper case 5 were made integral with a single screw, but the structure is not limited to this. For example, one may connect the lower case 6 and central chassis 4 with one screw and central chassis 4 and upper case 5 with another screw.

The cabinet is not limited to being constituted asymmetrically about the central chassis; it may be constituted, for example, symmetrically about the central chassis with a cross-section of an oblong shape.

As described above, with the electronic device cabinet of this invention, there is the effect that sufficient rigidity can be ensured even if it is thin.

Also, with the electronic device cabinet of the present invention, there is the effect that a smaller size of the device can be achieved.

What is claimed is:

1. A cabinet of an electronic device, which houses therein electronic components of the electronic device and comprises:

a chassis on which said electronic components are provided; and a pair of upper and lower housing members that hold said chassis between them and house said electronic components, wherein said chassis forms a base plate for said upper housing member and an upper plate for said lower housing member;

wherein said upper housing member and said lower housing member are of different sizes, such that a portion of said chassis protrudes from an edge of one of said upper and lower housing members while being coextensive with a corresponding edge of the other of said upper and lower housing members.

2. An electronic device comprising a cabinet which houses electronic components therein, said cabinet including:

a chassis on which said electronic components are provided; and a pair of upper and lower housing members that hold said chassis between them and house said electronic components, wherein said chassis forms a base plate for said upper housing member and an upper plate for said lower housing member;

wherein said upper housing member and said lower housing member are of different sizes, such that a portion of said chassis protrudes from an edge of one of said upper and lower housing members while being coextensive with a corresponding edge of the other of said upper and lower housing members.

3. The electronic device as described in claim 2, wherein said chassis has a rear surface part that covers a rear surface of said cabinet.

4. The electronic device as described in claim 2, wherein when said electronic device is set up in vertical orientation, in which said chassis is horizontal with respect to the floor and said pair of housing members are put on top of another, the housing member of said pair of housing members, that is positioned on the top has a volume that is larger than the housing member that is positioned on the bottom.

5. The electronic device as described in claim 4, wherein said pair of housing members each has roughly the shape of a rectangular parallelepiped, and said pair of housing members are constituted so that prescribed surfaces of said pair of housing members are mutually coplanar, and thus the electronic device can be set up in vertical orientation with said coplanar surfaces form a base.

6. The electronic device as described in claim 5, wherein said chassis has a rear surface part that roughly covers a rear surface of said cabinet, and said coplanar surfaces are each roughly perpendicular to a front surface of said rear surface part.

7. The electronic device as described in claim 4, wherein said pair of housing members are constituted so that prescribed surfaces thereof are mutually coplanar, and thus the electronic device can be set up in vertical orientation with said coplanar surfaces forming a base.

8. A cabinet of an electronic device, which houses therein electronic components of the electronic device, comprising:

a rigid central chassis;

an upper case formed above said central chassis, said central chassis being coupled to said upper case to form a base of said upper case; and a lower case formed below said central chassis, said center chassis being coupled to said lower case to form an upper plate of said lower case;

wherein said upper case and said lower case are of different sizes, such that a portion of said chassis protrudes from an edge of one of said upper and lower cases while being coextensive with a corresponding edge of the other of said upper and lower cases.

9. An electronic device comprising a cabinet that houses electronic components of the electronic device therein, said cabinet comprising:

a rigid central chassis;

an upper case formed above said central chassis, said central chassis being coupled to said upper case to form a base of said upper case; and a lower case formed below said central chassis, said central chassis being coupled to said lower case to form an upper plate of said lower case;

wherein said upper case and said lower case are of different sizes, such that a portion of said chassis protrudes from an edge of one of said upper and lower cases while being coextensive with a corresponding edge of the other of said upper and lower cases.

10. The electronic device as described in claim 9, wherein said upper case and said lower case are asymmetrical with respect to said central chassis.

11. The electronic device as described in claim 9, wherein said upper case and said lower case are formed by relatively thin members.

12. The electronic device as described in claim 9, wherein said upper case and said lower case are each connected by a fastening member to said central chassis.

13. An electronic device comprising a cabinet which houses electronic components therein, said cabinet including:

a chassis on which said electronic components are provided; and a pair of housing members that hold said chassis between them and house said electronic components; wherein said pair of housing members and chassis are made integral with each other by a screw inserted into a screw hole formed in one of said housing members;

wherein each of said pair housing member are of different sizes, such that a portion of said chassis protrudes from an edge of one housing member while being coextensive with a corresponding edge of the other of said housing members.

14. An electronic device comprising a cabinet which houses electronic components therein, said cabinet including:

a chassis on which said electronic components are provided; and a pair of housing members that hold said chassis between them and house said electronic components;

wherein when said electronic device is set up in horizontal orientation, in which said chassis is horizontal with respect to the floor and said pair of housing members are put on top of another, the housing member of said pair of housing members, that is positioned on the top has a volume that is larger than the housing member that is positioned on the bottom;

wherein said housing member that is positioned on the top protrudes farther forward, on a front surface side that faces the user, than said housing member that is positioned on the bottom; and wherein switches are provided on said front surface side of said housing member that is positioned on the top.

15. An electronic device comprising a cabinet which houses electronic components therein, said cabinet including:

a chassis on which said electronic components are provided; and a pair of housing members that hold said chassis between them and house said electronic components;

wherein said pair of housing members hold said chassis between them so that part of said chassis is exposed, and wherein the degree of freedom in a shape of said cabinet can be increased by changing relative positions of said pair of housing members.

16. An electronic device comprising a cabinet which houses electronic components therein, said cabinet including:

a chassis on which said electronic components are provided; and a pair of upper and lower housing members that hold said chassis between them and house said electronic components, wherein said chassis forms a base plate for said upper housing member and an upper plate for said lower housing member;

a power source circuit board for supplying a power source to the device; and a control board that controls the electronic device wherein said power source circuit board and said control board are arranged on opposite sides with said chassis positioned between them.

17. An electronic device comprising a cabinet which houses electronic components therein, said cabinet including:

a chassis on which said electronic components are provided; and a pair of upper and lower housing members that hold said chassis between them and house said electronic components, wherein said chassis forms a base plate for said upper housing member and an upper plate for said lower housing member;

wherein when said electronic device is set up in vertical orientation, in which said chassis is horizontal with respect to the floor and said pair of housing members are put on top of another, the housing member of said pair of housing members, that is positioned on the top has a volume that is larger than the housing member that is positioned on the bottom;

and said housing member that is positioned on the top protrudes farther forward, on a front surface side that faces the user, than said housing member that is positioned on the bottom.

18. The electronic device as described in claim 17, wherein a mounting part for mounting peripheral devices is provided on the front surface side of said housing member that is positioned on the top.

* * * * *